(12) United States Patent
Chung et al.

(10) Patent No.: US 11,114,036 B2
(45) Date of Patent: Sep. 7, 2021

(54) SCAN DRIVER AND DISPLAY DEVICE FOR DRIVING A PLURALITY OF SCAN LINES

(71) Applicant: Samsung Display Co., Ltd., Yongin-si (KR)

(72) Inventors: Boyoung Chung, Suwon-si (KR); Youngwan Seo, Suwon-si (KR); Dongwoo Kim, Yongin-si (KR); Yeonkyung Kim, Seoul (KR); Chong Chul Chai, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/434,432

(22) Filed: Jun. 7, 2019

(65) Prior Publication Data

US 2019/0378463 A1 Dec. 12, 2019

(30) Foreign Application Priority Data

Jun. 8, 2018 (KR) .................. 10-2018-0065948

(51) Int. Cl.
*G06F 3/038* (2013.01)
*G09G 3/3266* (2016.01)
*G09G 3/3225* (2016.01)

(52) U.S. Cl.
CPC ......... *G09G 3/3266* (2013.01); *G09G 3/3225* (2013.01); *G09G 2300/0426* (2013.01); *G09G 2310/0205* (2013.01); *G09G 2310/08* (2013.01)

(58) Field of Classification Search
CPC .............. G09G 3/3266; G09G 3/3225; G09G 2300/0426; G09G 2310/0205

USPC ......................................... 345/208
See application file for complete search history.

(56) References Cited

U.S. PATENT DOCUMENTS

| 8,553,026 | B2 | 10/2013 | Park | |
|---|---|---|---|---|
| 2007/0159250 | A1* | 7/2007 | Tsuchi | H03F 3/45233 330/253 |
| 2012/0001952 | A1* | 1/2012 | Hasegawa | G09G 3/3614 345/690 |
| 2012/0161611 | A1* | 6/2012 | Ahn | G09G 3/3233 313/504 |
| 2014/0078029 | A1* | 3/2014 | Jang | G09G 3/32 345/82 |
| 2014/0355733 | A1* | 12/2014 | Kim | G09G 3/3266 377/67 |
| 2016/0035262 | A1* | 2/2016 | Lee | G09G 3/3266 345/690 |

FOREIGN PATENT DOCUMENTS

KR 10-1793633 11/2017

* cited by examiner

*Primary Examiner* — Jonathan M Blancha
(74) *Attorney, Agent, or Firm* — H.C. Park & Associates, PLC

(57) ABSTRACT

A scan driver includes a plurality of circuit stages, each circuit stage including a first input part configured to transfer a carry signal to a first node in response to a first clock signal, a second input part configured to transfer the first clock signal to a second node in response to a signal of the first node, a first output part configured to transfer a third clock signal to an output terminal in response to a signal of the second node, a holding part configured to maintain a signal of a third node response to a second clock signal, and a second output part configured to transfer a signal of the third node to the output terminal in response to the second clock signal.

16 Claims, 10 Drawing Sheets

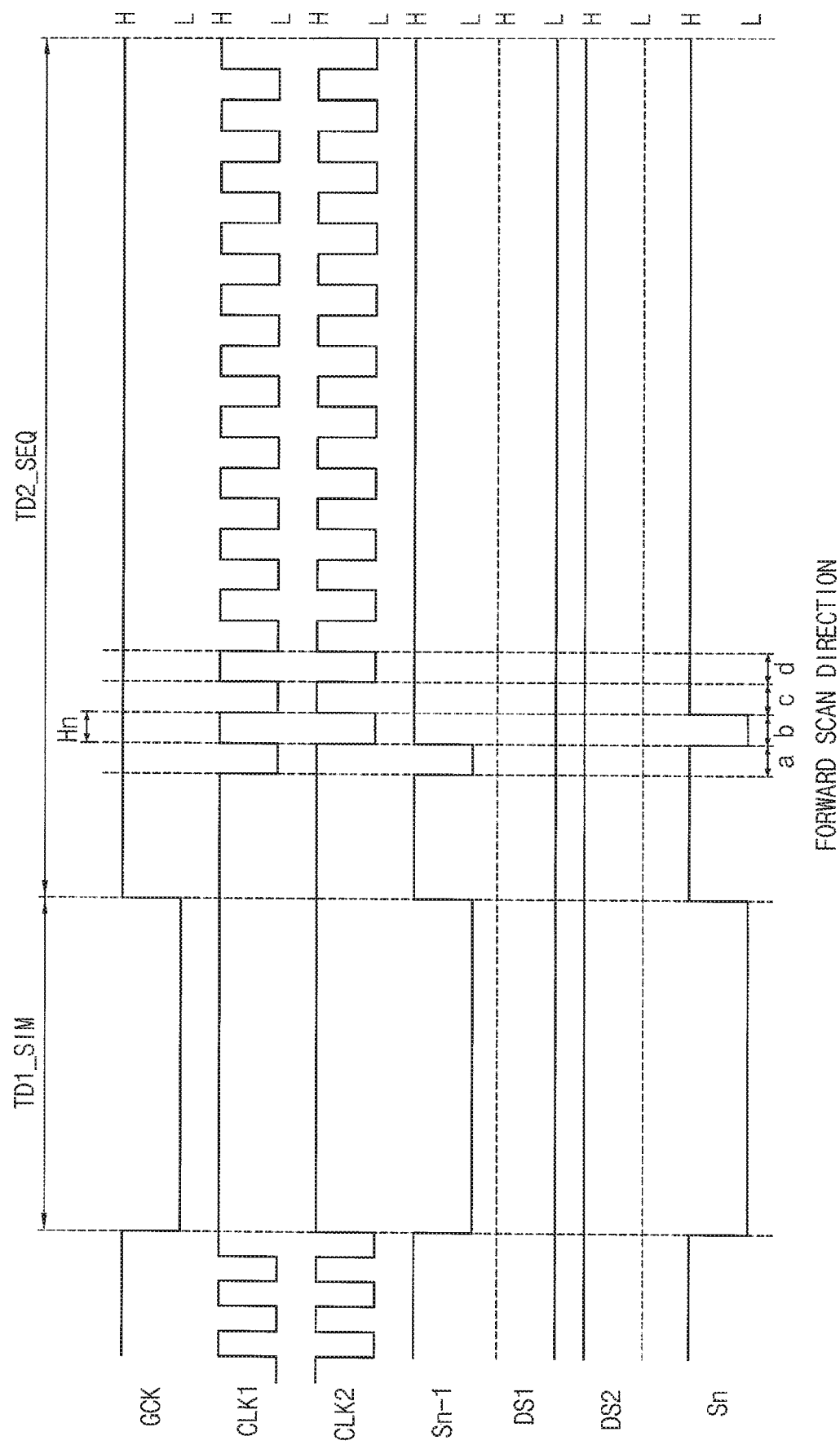

SCAN DRIVER AND DISPLAY DEVICE FOR DRIVING A PLURALITY OF SCAN LINES

CROSS REFERENCE TO RELATED APPLICATION

This application claims priority from and the benefit of Korean Patent Application No. 10-2018-0065948 filed on Jun. 8, 2018, which is hereby incorporated by reference for all purposes as if fully set forth herein.

BACKGROUND

Field

Exemplary embodiments of the invention relate generally to a scan driver and a display device having the scan deriver and, more specifically to scan driver for sequentially driving, simultaneously driving and bidirectional driving a plurality of scan lines, and a display device having the scan driver.

Discussion of the Background

Recently, an organic light emitting display device is widely used as a display device.

The organic light emitting display device includes a plurality of pixels. Each of the plurality of pixels includes an organic light emitting diode and a pixel circuit driving the organic light emitting diode. The pixel circuit includes a plurality of transistors and a plurality of capacitors.

The organic light emitting display device includes a scan driver which outputs a plurality scan signals to a plurality of scan lines for driving a plurality of pixel circuits. The scan driver sequentially outputs the plurality scan signals to the plurality of scan lines.

The above information disclosed in this Background section is only for understanding of the background of the inventive concepts, and, therefore, it may contain information that does not constitute prior art.

SUMMARY

Exemplary embodiments of the inventive concepts provide a scan driver for sequentially driving, simultaneously driving, and bidirectional driving a plurality of scan lines.

Exemplary embodiments of the inventive concepts also provide a display device having the scan driver.

Additional features of the inventive concepts will be set forth in the description which follows, and in part will be apparent from the description, or may be learned by practice of the inventive concepts.

According to an exemplary embodiment of the inventive concepts, a scan driver includes a plurality of circuit stages cascade-connected with each other and outputting a plurality of gate signals, each circuit stage including a first input part configured to transfer a carry signal to a first node in response to a first clock signal, a second input part configured to transfer the first clock signal to a second node in response to a signal of the first node, a first output part configured to transfer a third clock signal to an output terminal in response to a signal of the second node, a holding part configured to maintain a signal of a third node response to a second clock signal and a second output part configured to transfer a signal of the third node to the output terminal in response to the second clock signal.

In an exemplary embodiment, the holding part may include a sixth transistor and a and seventh transistor, the sixth transistor may include a control electrode connected to the second node, a first electrode connected to the seventh transistor and a second electrode connected to the output terminal, and the seventh transistor may include a control electrode receiving the second clock signal, a first electrode connected to the third node and a second electrode connected to the sixth transistor.

In an exemplary embodiment, the circuit stage may further include a simultaneous driving part configured to control the second output part in response to the third clock signal, wherein the third clock signal may have a first level for a simultaneous driving period and a second level for a sequential driving period, and the simultaneous driving part may apply the second level of a second driving voltage to the third node in response to the first level of the third clock signal in the simultaneous driving period.

In an exemplary embodiment, the simultaneous driving part may include a ninth transistor, the ninth transistor comprises a control electrode connected to the third clock terminal, a first electrode connected to a second driving voltage terminal and a second electrode connected to the first node.

In an exemplary embodiment, the simultaneous driving part may include a ninth transistor, the ninth transistor may include a control electrode connected to the third clock terminal, a first electrode connected to a second driving voltage terminal and a second electrode connected to the third node.

In an exemplary embodiment, the circuit stage may further include a first output control part configured to transfer the first clock signal to the second node in response to the first clock signal and a second output control part configured to transfer a signal of the first node to the third node in response to a first driving voltage.

In an exemplary embodiment, the circuit stage may further include a first output control part configured to transfer a first driving voltage to the second node in response to the first clock signal and a second output control part configured to transfer a signal of the first node to the third node in response to the first driving voltage.

In an exemplary embodiment, the first output part may include a first transistor and a first capacitor, the first transistor may include a control electrode connected to the second node, a first electrode connected to the third clock terminal and a second electrode connected to the output terminal, and the first capacitor may include a first electrode connected to the third clock terminal and a second electrode connected to the second node.

In an exemplary embodiment, the second output part may include a second transistor and a second capacitor, the second transistor may include a control electrode connected to the third node, a first electrode connected to the second clock terminal and a second electrode connected to the output terminal, and the second capacitor may include a first electrode connected to the output terminal and a second electrode connected to the third node.

In an exemplary embodiment, the circuit stage may further include a selecting part configured to output a previous scan signal outputted from a previous circuit stage or a next scan signal outputted from a next circuit stage to the first input part in response to a first direction signal and a second direction signal.

According to an exemplary embodiment of the inventive concepts, there is provided a display device including a display panel comprising a switching transistor connected to a scan line and a data line, an emission control transistor connected to the switching transistor and an organic light emitting diode connected to emission control transistor, a timing controller configured to generate a first clock signal, a second clock signal being different from the first clock signal and a third clock signal being different from the first and second clock signals, a scan driver configured to generate a plurality of scan signals based on the first, second and third clock signals, to simultaneously output the plurality of scan signals during a simultaneous driving period and to sequentially output the plurality of scan signals during a sequential driving period, the scan driver comprising a plurality of circuit stages cascade-connected with each other, each circuit stage including a first input part configured to transfer a carry signal to a first node in response to a first clock signal, a second input part configured to transfer the first clock signal to a second node in response to a signal of the first node, a first output part configured to transfer a third clock signal to an output terminal in response to a signal of the second node, a holding part configured to maintain a signal of a third node response to a second clock signal and a second output part configured to transfer a signal of the third node to the output terminal in response to the second clock signal.

In an exemplary embodiment, the holding part may include a sixth transistor and a and seventh transistor, the sixth transistor comprising a control electrode connected to the second node, a first electrode connected to the seventh transistor and a second electrode connected to the output terminal, and the seventh transistor comprising a control electrode receiving the second clock signal, a first electrode connected to the third node and a second electrode connected to the sixth transistor.

In an exemplary embodiment, the circuit stage may further include a simultaneous driving part configured to control turning off the second output part in response to the third clock signal, wherein the third clock signal has a first level for a simultaneous driving period and a second level for a sequential driving period, and the simultaneous driving part applies the second level of a second driving voltage to the third node in response to the first level of the third clock signal in the simultaneous driving period.

In an exemplary embodiment, the simultaneous driving part may include a ninth transistor, the ninth transistor may include a control electrode connected to the third clock terminal, a first electrode connected to a second driving voltage terminal and a second electrode connected to the first node.

In an exemplary embodiment, the simultaneous driving part may include a ninth transistor, the ninth transistor may include a control electrode connected to the third clock terminal, a first electrode connected to a second driving voltage terminal and a second electrode connected to the third node.

In an exemplary embodiment, the circuit stage may further include a first output control part configured to transfer the first clock signal to the second node in response to the first clock signal and a second output control part configured to transfer a signal of the first node to the third node in response to a first driving voltage.

In an exemplary embodiment, the circuit stage may further include a first output control part configured to transfer the first driving voltage to the second node in response to a first clock signal and a second output control part configured to transfer a signal of the first node to the third node in response to the first driving voltage.

In an exemplary embodiment, the first output part may include a first transistor and a first capacitor, the first transistor may include a control electrode connected to the second node, a first electrode connected to the third clock terminal and a second electrode connected to the output terminal, and the first capacitor may include a first electrode connected to the third clock terminal and a second electrode connected to the second node.

In an exemplary embodiment, the second output part may include a second transistor and a second capacitor, the second transistor may include a control electrode connected to the third node, a first electrode connected to the second clock terminal and a second electrode connected to the output terminal, and the second capacitor may include a first electrode connected to the output terminal and a second electrode connected to the third node.

In an exemplary embodiment, the timing controller may be configured to output a first direction signal corresponding to a forward direction scan direction and a second direction signal corresponding to a reverse direction scan direction to the scan driver, and the circuit stage may further include a selecting part configured to output a previous scan signal outputted from a previous circuit stage or a next scan signal outputted from a next circuit stage to the first input part in response to a first direction signal and a second direction signal.

According to the inventive concepts, the scan driver may simultaneously output a plurality of scan signals during the simultaneous driving period and sequentially output a plurality of scan signals during the sequential driving period. In addition, in the sequential driving period, the scan driver may sequentially output a plurality of scan signals along the forward direction or sequentially output a plurality of scan signals along the reverse direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 8A and 8B are waveform diagrams illustrating a method of driving the circuit stage according to one exemplary embodiment.

DETAILED DESCRIPTION OF THE INVENTION

Figure 1:
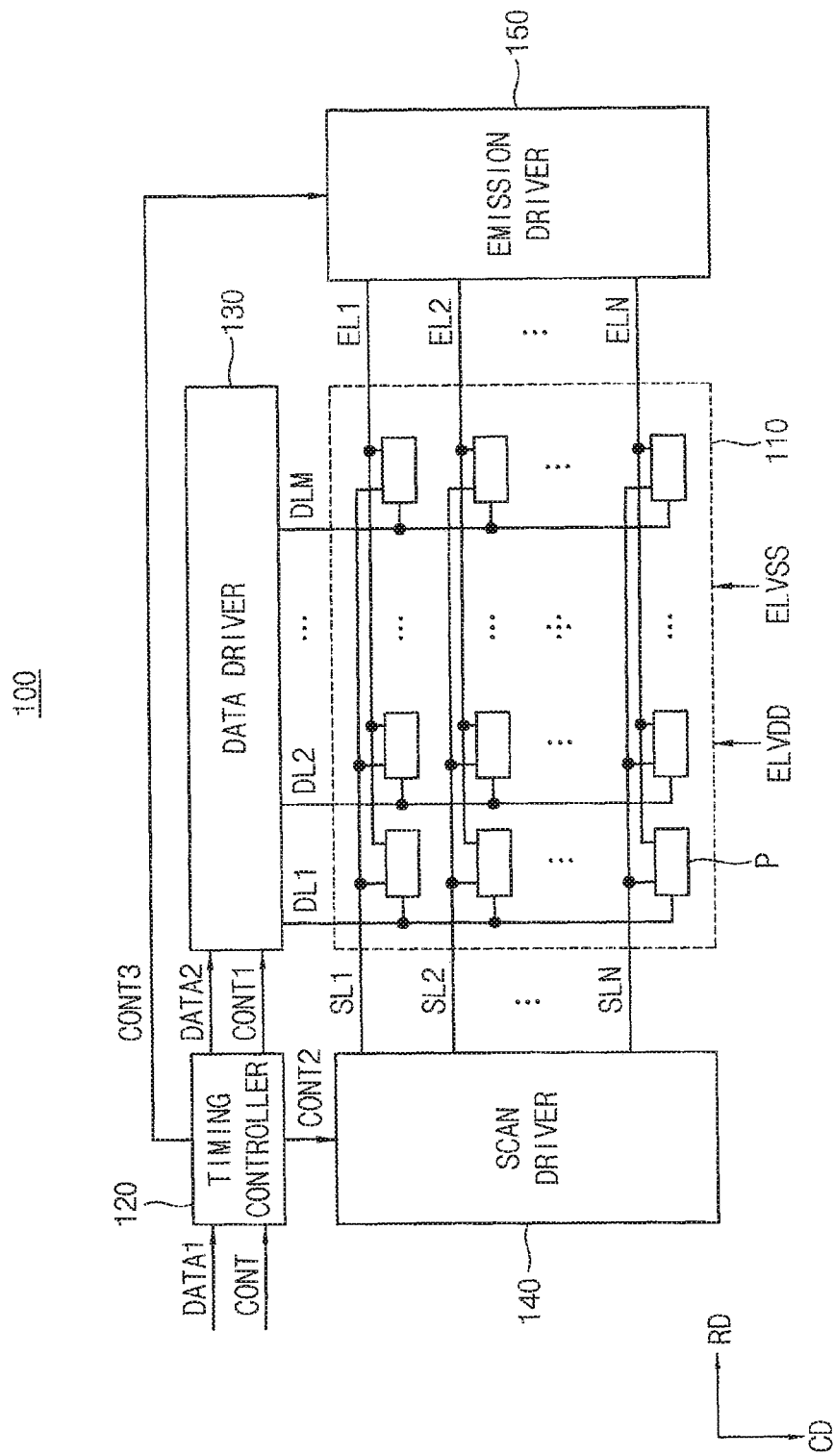
FIG. 1 is a block diagram illustrating a display device according to one exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram illustrating a display device according to one exemplary embodiment.

Referring to FIG. 1, the display device may include a display panel 110, a timing controller 120, a data driver 130, a scan driver 140 and an emission driver 150.

The display panel 110 may include a plurality of pixels P, a plurality of scan lines SL1, . . . , SLN, a plurality of data lines DL1, . . . , DLM and a plurality of emission control lines EL1, . . . , ELN ' N' and 'M' are natural numbers.

The pixels P may be arranged as a matrix type which includes a plurality of pixel rows and a plurality of pixel columns. Each pixel P is connected to a scan line, a data line and an emission control line.

The data lines DL1, . . . , DLM may extend in a column direction CD and be arranged in a row direction RD. The data lines DL1, . . . , DLM are connected to the data driver 130 and transfer data voltages to the pixels P.

The scan lines SL1, ..., SLN may extend in the row direction RD, and be arranged in the column direction CD. The scan lines SL1, ..., SLN are connected to the scan driver 140 and transfer scan signals the pixels P.

The emission control lines EL1, ..., ELN may extend in the row direction RD, and be arranged in the column direction CD. The emission control lines EL1, ..., ELN are connected to the emission driver 150 and transfer emission control signals to the pixels P.

In addition, the pixels P may receive a first emission power voltage ELVDD and a second emission power voltage ELVSS.

Each of the pixels P may receive a data voltage in response to the scan signal, and emit a light corresponding to the data voltage using the first and second emission power voltages ELVDD and ELVSS.

The timing controller 120 may receive an image signal DATA1 and a control signal CONT from an external device. The image signal DATA1 may include red, green and blue data. The control signal CONT may include a horizontal synchronization signal Hsync, a vertical synchronization signal Vsync, a main clock signal MCLK, etc.

The timing controller 120 may convert the image signal DATA1 to image data DATA2 corresponding to a pixel structure and a resolution of the display panel 110.

The timing controller 120 may generate a first control signal CONT1 for driving the data driver 130, a second control signal CONT2 for driving the scan driver 140 and a third control signal CONT3 for driving the emission driver 150 based on the control signal CONT.

The data driver 130 may convert the image data DATA2 to data voltage and output the data voltage to the data lines DL1, ..., DLM in response to the first control signal CONT1.

The scan driver 140 may generate a plurality of scan signals in response to the second control signal CONT2 according to a driving mode of the display device.

The second control signal CONT2 may include a start pulse signal SP, a second clock signal CLK2, a first clock signal CLK1 and a third clock signal GCK.

According to the exemplary embodiment, the scan driver 140 is configured to simultaneously output a plurality of scan signals having a first level based on the second control signal CONT2. Alternatively, the scan driver 140 is configured to sequentially output the plurality of scan signals having the first level along a scan direction based on the second control signal CONT2. Alternatively, the scan driver 140 is configured to sequentially output the plurality of scan signals having the first level along a forward direction or a reverse direction of the scan direction.

The emission driver 150 may generate a plurality of emission control signals in response to the third control signal CONT3 according to a driving mode of the display device.

The emission driver 150 may simultaneously output emission control signals of a first level to the emission control lines EL1, ..., ELN based on the third control signal CONT3. Alternatively, the scan driver 140 may sequentially output emission control signals of the first level to the emission control lines EL1, ..., ELN along the column direction CD being a scan direction based on the third control signal CONT3. Alternatively, the scan driver 140 may simultaneously output emission control signals of a first level to the emission control lines EL1, ..., ELN during a simultaneous driving period and sequentially output emission control signals of the first level to the emission control lines EL1, ..., ELN during a sequential driving period.

Figure 2:
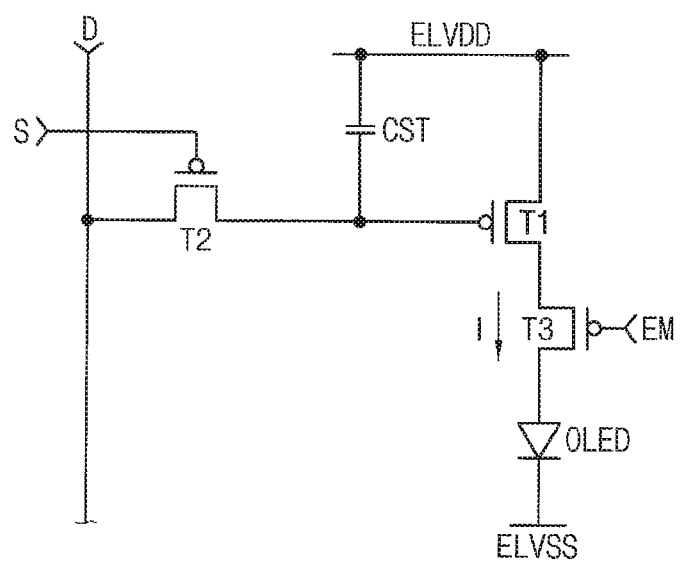
FIG. 2 is a circuit diagram illustrating a pixel of FIG. 1.

FIG. 2 is a circuit diagram illustrating a pixel of FIG. 1.

Referring to FIGS. 1 and 2, for example, the pixel P includes a pixel circuit. The pixel circuit may include an organic light emitting diode OLED, a driving transistor T1, a capacitor CST, a switching transistor T2, and an emission control transistor T3.

The driving transistor T1 includes a control electrode connected to the switching transistor T2, a first electrode receiving the first emission power voltage ELVDD and a second electrode connected to the emission control transistor T3.

The capacitor CST includes a first electrode receiving the first emission power voltage ELVDD and a second electrode connected to the control electrode of the driving transistor T1.

The switching transistor T2 include a control electrode a scan signal S, a first electrode receiving a data voltage D and a second electrode connected to the control electrode of the driving transistor T1.

The emission control transistor T3 includes a control electrode receiving the emission control signal EM, a first electrode connected to the second electrode of the driving transistor T1 and a second electrode connected to the organic light emitting diode OLED.

The organic light emitting diode OLED includes a first electrode connected to the emission control transistor T3 and a second electrode receiving the second emission power voltage ELVSS.

When the emission control transistor T3 is turned on, a current is applied to the organic light emitting diode OLED through the driving transistor T1. Thus, the organic light emitting diode OLED may emit a light.

The pixel circuit may be not limited thereto and may be designed variously.

Figure 3:
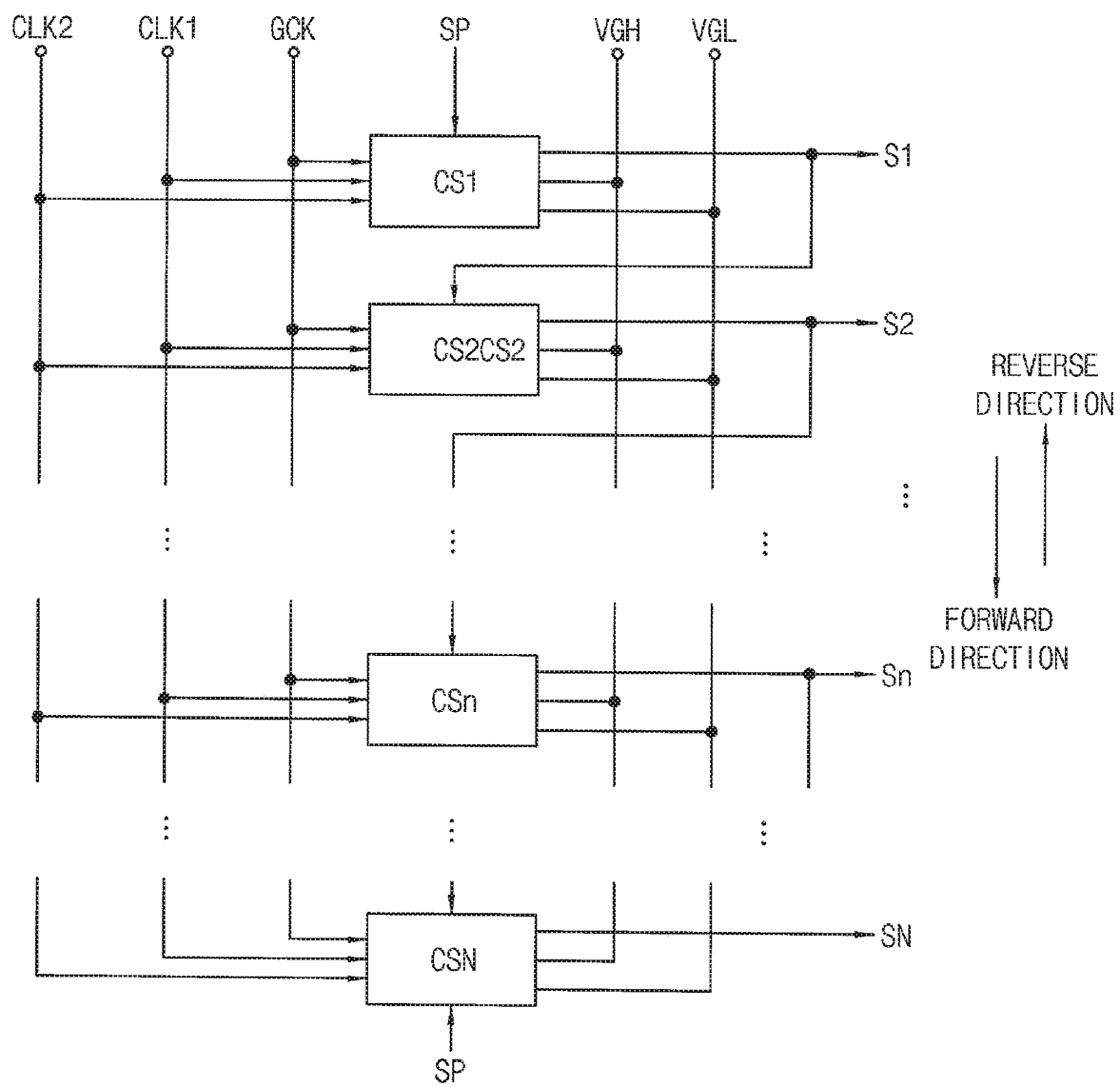
FIG. 3 is a block diagram illustrating a scan driver of FIG. 1.

FIG. 3 is a block diagram illustrating a scan driver of FIG. 1.

Referring to FIGS. 1 and 3, the scan driver 140 may include a plurality of circuit stages CS1, ..., CSn, ..., CSN cascade-connected with each other and the plurality of circuit stages CS1, ..., CSn, ..., CSN is configured to output a plurality of scan signals S1, S2, ..., Sn, ..., SN.

According to one exemplary embodiment, the scan driver 140 may simultaneously output a plurality of scan signals S1, S2, ..., Sn, ..., SN, and sequentially output a plurality of scan signals S1, S2, ..., Sn, ..., SN. In addition, according to one exemplary embodiment, the scan driver 140 sequentially output a plurality of scan signals S1, S2, ..., Sn, ..., SN along a forward direction of the scan direction or sequentially output a plurality of scan signals SN, ..., Sn, ..., S2, S1 a reverse direction of the scan direction.

The circuit stages CS1, ..., CSn, ..., CSN may receive a carry signal, a first driving voltage VGL, a second driving voltage VGH, a first clock signal CLK1, a second clock signal CLK2 and a third clock signal GCK.

The carry signal may be a start pulse signal SP provided from the timing controller 120 or a previous scan signal provided from a previous circuit stage.

For example, when the scan direction is the forward direction, the first circuit stage CS1 receives a start pulse signal SP as a carry signal, and outputs a first scan signal S1 in response to the start pulse signal SP. A second circuit stage CS2 receives a first scan signal S1 of the first circuit stage CS1 which is the previous circuit stage as the carry signal and outputs a second scan signal S2 in response to the first scan signal S1. However, when the scan direction is the reverse direction, an n-th circuit stage CSN that is a last circuit stage receives a start pulse signal SP as a carry signal.

The first driving voltage VGL has a first level, and the second driving voltage VGH has a second level being higher than the first level. For example, the first driving voltage VGL may have a low voltage L and the second driving voltage VGH may have a high voltage H.

The first and second driving voltages VGL and VGH may be provided to the circuit stages CS1, ..., CSn, ..., CSN, commonly.

The first clock signal CLK1 has a second level being different from the first level. For example, the first level may be a low voltage L and the second level may be a high voltage H.

The first clock signal CLK1 may be a DC (direct current) signal having the high voltage during a simultaneous driving period, and an AC (alternating current) signal swing between the high voltage and the low voltage during a sequential driving period. For example, the first clock signal CLK1 may control an output timing of an even numbered scan signal outputted from an even numbered circuit stage of the circuit stages CS1, ..., CSn, ..., CSN.

The second clock signal CLK2 may be a DC signal having the high voltage during a simultaneous driving period, and an AC signal swing between the high voltage and the low voltage during a sequential driving period. The second clock signal CLK2 may be delayed by a 1 horizontal period (1H) from the first clock signal CLK1. For example, the second clock signal CLK2 may control an output timing of an odd numbered scan signal outputted from an odd numbered circuit stage of the circuit stages CS1, ..., CSn, ..., CSN.

The third clock signal GCK may be a DC signal having the low voltage during a simultaneous driving period, and a DC signal having the high voltage during a sequential driving period. The third clock signal GCK may be provided to the circuit stages CS1, ..., CSn, ..., CSN, commonly.

According to the an exemplary embodiment, the circuit stages CS1, ..., CSn, ..., CSN may simultaneously output the first to n-th scan signals S1, S2, ..., Sn, ..., SN having the low voltage during all the simultaneous driving period.

In addition, the circuit stages CS1, ..., CSn, ..., CSN may sequentially output the first to n-th scan signals S1, S2, ..., Sn, ..., SN having the low voltage in a corresponding horizontal period during the sequential driving period.

In addition, when the scan direction is the forward direction, the circuit stages CS1, ..., CSn, ..., CSN may sequentially output the first to n-th scan signals S1, S2, ..., Sn, ..., SN having the low voltage in a corresponding horizontal period along the forward direction during the sequential driving period. Alternatively, when the scan direction is the reverse direction, the circuit stages CS1, ..., CSn, ..., CSN may sequentially output the n-th to first scan signals Sn, ..., S2, S1 having the low voltage in a corresponding horizontal period along the reverse direction during the sequential driving period FIG. 4 is a circuit diagram illustrating a circuit stage according to one exemplary embodiment.

Figure 4:
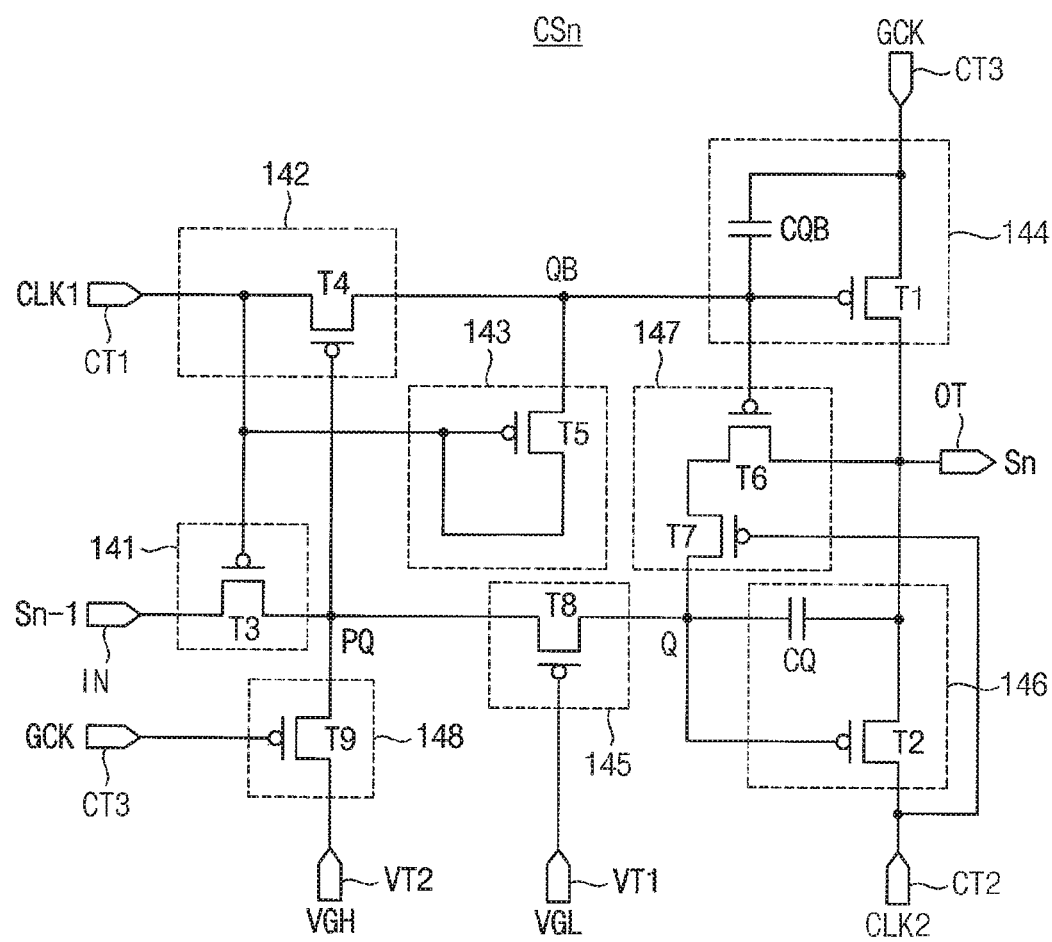
FIG. 4 is a circuit diagram illustrating a circuit stage according to one exemplary embodiment.

Referring to FIGS. 3 and 4, an n-th circuit stage CSn may include an input terminal IN, a first clock terminal CT1, a second clock terminal CT2, a third clock terminal CT3, a first driving voltage terminal VT1, a second driving voltage terminal VT2 and an output terminal OT.

The input terminal IN receives a carry signal. The carry signal may be a start pulse signal or a previous scan signal outputted from a previous circuit stage.

The first clock terminal CT1 receives a first clock signal CLK1.

The second clock terminal CT2 receives a second clock signal CLK2 delayed from the first clock signal CLK1. For example, the second clock signal CLK2 may be delayed from the first clock signal CLK1 by a 1 horizontal period (1H).

The third clock terminal CT3 receives the third clock signal GCK. The third clock signal GCK has a low voltage during a simultaneous driving period and a high voltage during the sequential driving period. The simultaneous driving period and the sequential driving period may be designed variously according to a method of driving the display device.

The first driving voltage terminal VT1 receives a first driving voltage VGL. The first driving voltage VGL may have a low voltage L.

The second driving voltage terminal VT2 receives a second driving voltage VGH. The second driving voltage VGH may have a high voltage H.

The output terminal OT outputs an n-th scan signal Sn being an output signal.

For example, referring to the first circuit stage CS1, the input terminal IN receives a start pulse signal SP outputted from the timing controller 120 as the carry signal. The first clock terminal CT1 receives a first clock signal CLK1, a second clock terminal CT2 receives a second clock signal CLK2, and a third clock terminal CT3 receives a third clock signal GCK. The first driving voltage terminal VT1 receives a first driving voltage VGL, the second driving voltage terminal VT2 receives a second driving voltage VGH, and the output terminal OT outputs a first scan signal S1.

Referring to a second circuit stage CS2, the input terminal IN receives the first scan signal S1 outputted from the first circuit stage CS1 as the carry signal, the first clock terminal CT1 receives the second clock signal CLK2 opposite to the first circuit stage CS1, the second clock terminal CT2 receives the first clock signal CLK1 opposite to the first circuit stage CS1, the third clock terminal CT3 receives the third clock signal GCK, the first driving voltage terminal VT1 receives the first driving voltage VGL, the second driving voltage terminal VT2 receives the second driving voltage VGH, and the output terminal OT outputs a second scan signal S2.

Hereinafter, the n-th circuit stage CSn is explained.

Transistors in the circuit stage may be a PMOS (P-channel Metal Oxide Semiconductor) transistor which turns on in response to a low voltage and not limited thereto. The transistors may be an NMOS (N-channel Metal Oxide Semiconductor) transistor which turns on in response to a high voltage.

Referring to the n-th circuit stage CSn, the input terminal IN receives an (n−1)-th scan signal Sn−1 as the carry signal, the first clock terminal CT1 receives a first clock signal CLK1, a second clock terminal CT2 receives a second clock signal CLK2, a third clock terminal CT3 receives a third clock signal GCK, and the output terminal OT outputs an n-th scan signal Sn.

The n-th circuit stage CSn may includes a first input part 141, a second input part 142, a first output control part 143, a first output part 144, a second output control part 145, a second output part 146, a holding part 147 and a simultaneous driving part 148.

The first input part 141 transfers the (n−1)-th scan signal Sn−1 received from an input terminal IN to the first node (PQ node) PQ in response to the first clock signal received from the first clock terminal CT1. The first input part 141 includes a third transistor T3. The third transistor T3 includes a control electrode connected to the first clock terminal CT1, a second electrode connected to the input terminal IN and a second electrode connected to the PQ node PQ.

The second input part 142 transfers the first clock signal CLK1 received from the first clock terminal CT1 to a second node (QB node) QB in response to a signal the PQ node PQ. The second input part 142 includes a fourth transistor T4. The fourth transistor T4 includes a control electrode connected to the PQ node PQ, a first electrode connected to the first clock terminal CT1 and a second electrode connected to the second node QB.

The first output control part 143 transfers the first clock signal CLK1 to the QB node QB in response to the first clock signal CLK1 received from the first clock terminal CT1. The first output control part 143 includes a fifth transistor T5. The fifth transistor T5 includes a control electrode and a first electrode which are connected to the first clock terminal CT1 and a second electrode connected to the QB node.

The first output part 144 transfers third clock signal GCK received from the third clock terminal CT3 to the output terminal OT in response to a signal of the QB node QB.

The first output part 144 includes a first transistor T1 and a first capacitor CQB.

The first transistor T1 includes a control electrode connected to the QB node QB, a first electrode connected to the third clock terminal CT3 and a second electrode connected to the output terminal OT. The first capacitor CQB includes a first electrode connected to the third clock terminal CT3 and a second electrode connected to the QB node QB.

The second output control part 145 transfers a signal of the PQ node PQ to third node (Q node) Q in response to the first driving voltage VGL received from the first driving voltage terminal VT1. The second output control part 145 includes an eighth transistor T8. The eighth transistor T8 includes a control electrode connected to the first driving voltage terminal VT1, a first electrode connected to the PQ node PQ and a second electrode connected to the Q node Q. The Q node may also be referred to as the third node.

The second output part 146 transfers the second clock signal CLK2 received from the second clock terminal CT2 to the output terminal OT in response to the signal of the Q node Q. The second output part 146 includes a second transistor T2 and a second capacitor CQ. The second transistor T2 includes a control electrode connected to the Q node Q, a first electrode connected to the second clock terminal CT2 and a second electrode connected to the output terminal OT. The second capacitor CQ includes a first electrode connected to the output terminal OT and a second electrode connected to the Q node Q.

The holding part 147 transfers the signal of the Q node Q to the output terminal OT in response to the second clock signal CLK2 received from the second clock terminal CT2 and a signal of the QB node QB. The holding part 147 includes a sixth transistor T6 and a seventh transistor T7. The seventh transistor T7 includes a control electrode connected to the second clock terminal CT2, a first electrode connected to the Q node Q and a second electrode connected to the sixth transistor T6. The sixth transistor T6 includes a control electrode connected to the QB node QB, a first electrode connected to the second electrode of the seventh transistor T7 and a second electrode connected to the output terminal OT.

The simultaneous driving part 148 transfers the second driving voltage VGH received from the second driving voltage terminal VT2 to the PQ node PQ in response to the third clock signal GCK. The simultaneous driving part 148 includes a ninth transistor T9. The ninth transistor T9 includes a control electrode connected to the third clock terminal CT3, a first electrode connected to the second driving voltage terminal VT2 and a second electrode connected to the PQ node PQ.

Figure 5:
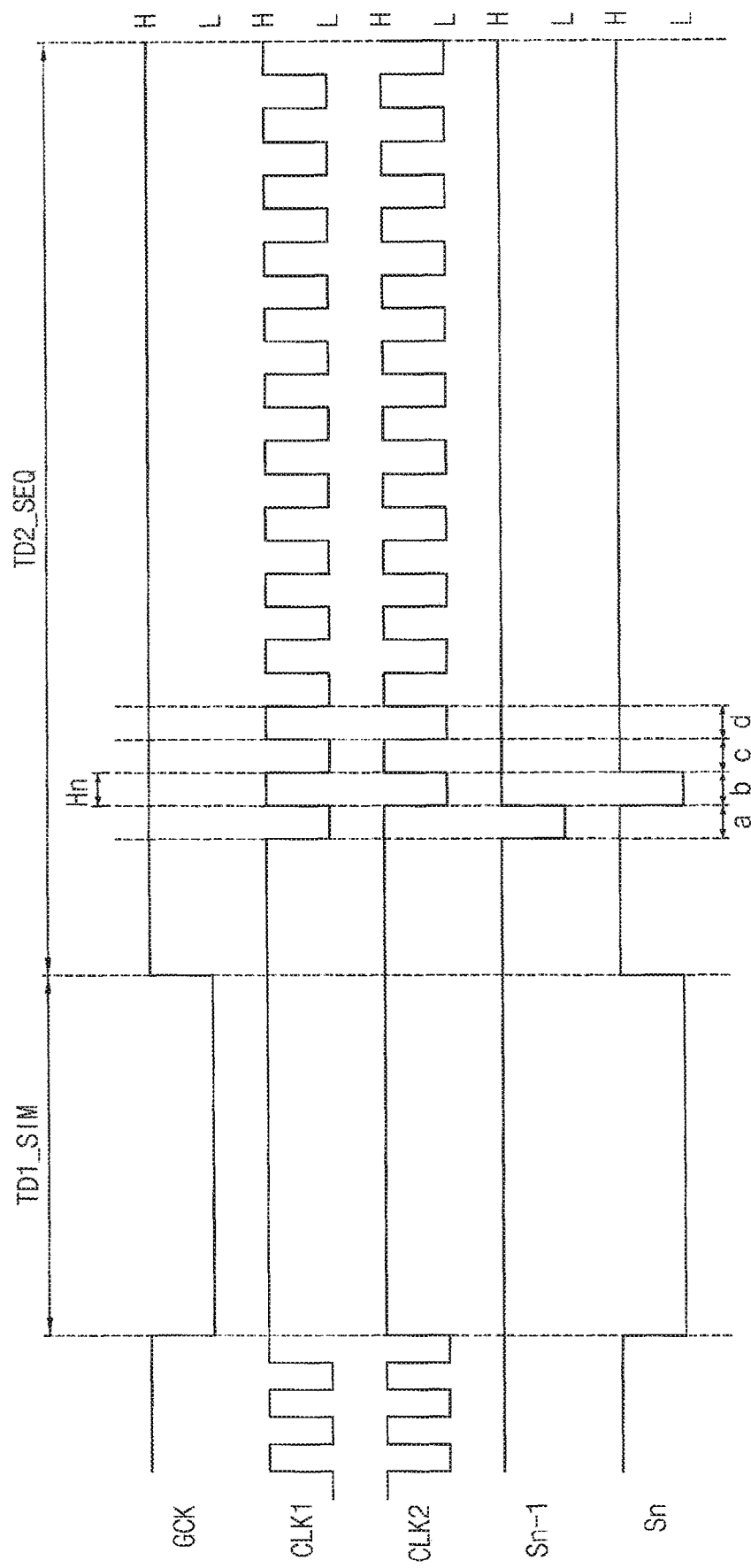
FIG. 5 is a waveform diagram illustrating a method of driving the circuit stage of FIG. 4.

FIG. 5 is a waveform diagram illustrating a method of driving the circuit stage of FIG. 4.

Referring to FIGS. 4 and 5, the n-th circuit stage CSn may drive to a simultaneous driving period TD1_SIM and a sequential driving period TD2_SEQ based on a control of the timing controller.

In the simultaneous driving period TD1_SIM, the first clock signal CLK1 has the high voltage H, a second clock signal CLK2 has the high voltage H, the third clock signal GCK has the low voltage L and the (n−1)-th scan signal Sn−1 that is the carry signal has the high voltage H.

The ninth transistor T9 is turned on in response to the low voltage L of the third clock signal GCK. When the ninth transistor T9 is turned on, the high voltage H of the second driving voltage VGH is applied to the PQ node PQ.

The eighth transistor T8 is turned on in response to the low voltage L of the first driving voltage VGL. When the eighth transistor T8 is turned on, the high voltage H of the PQ node PQ is applied to the Q node Q.

The second transistor T2 is turned off in response to the high voltage H of the Q node Q.

However, a voltage applied to the first electrode of the first capacitor CQB which is connected to the third clock terminal CT3 is changed from the high voltage H to the low voltage L, and the first capacitor CQB is bootstrapped. Thus, a voltage applied to the second electrode of the first capacitor CQB which is connected to the QB node QB is changed from the low voltage L to a bootstrapped voltage 2L being lower than the low voltage L.

The first transistor T1 is turned on in response to the bootstrapped voltage 2L, and thus, the low voltage L of the third clock signal GCK is transferred to the output terminal OT.

Thus, during the simultaneous driving period, the output terminal OT outputs the low voltage L of the third clock signal GCK as the scan signal Sn.

In the sequential driving period TD2_SEQ, the third clock signal GCK has the high voltage H different from low voltage L in the simultaneous driving period TD1_SIM. The first and second clock signals CLK1 and CLK2 have an AC signal which swings between the high voltage H and the low voltage L and have a repetitive cycle as a 2-horizontal period (2H). For example, the second clock signal CLK2 may have a phase opposite to that of the first clock signal CLK1. The first clock signal CLK1 may be delayed by a ½ repetitive cycle (1H) from the second clock signal CLK2.

The (n−1)-th scan signal Sn−1 that is the carry signal has the low voltage L for an (n−1)-th horizontal period Hn−1, and the high voltage H for remaining horizontal periods of the sequential driving period TD2_SEQ.

A simultaneous driving period of the n-th circuit stage CSn may include a first period 'a', a second period 'b', a third period 'c' and a fourth period 'd'.

Referring to the first period 'a', the first clock signal CLK1 has the low voltage L, the second clock signal CLK2 has the high voltage H, the third clock signal GCK has the high voltage H, and the (n−1)-th scan signal Sn−1 has the low voltage L.

The simultaneous driving part 148 includes the ninth transistor T9. The ninth transistor T9 is turned off in response to the high voltage H of the third clock signal GCK. Thus, during the sequential driving period TD2_SEQ, the simultaneous driving part 148 is not driven by the high voltage H of the third clock signal GCK.

The first input part 141 includes the third transistor T3. The third transistor T3 is turned on in response to the low voltage L of the first clock signal CLK1, and thus the low voltage L of the (n−1)-th scan signal Sn−1 is transferred to the PQ node PQ.

The second input part 142 includes the fourth transistor T4. The fourth transistor T4 is turned on in response to the low voltage L of the PQ node PQ and thus the low voltage L of the first clock signal CLK1 is transferred to the QB node QB.

The first output control part 143 includes the fifth transistor T5. The fifth transistor T5 is turned on in response to the low voltage L of the first clock signal CLK1 and thus, the low voltage L of the first clock signal CLK1 is transferred to the QB node QB.

The first output part 144 transfers the high voltage H of the third clock signal GCK received from the third clock terminal CT3 to the output terminal OT in response to the low voltage L of the QB node QB. The first electrode of the first capacitor CQB receives the high voltage H of the third clock signal GCK and the second electrode of the first capacitor CQB receives the low voltage L of the QB node QB.

The second output control part 145 includes an eighth transistor T8. The eighth transistor T8 is turned on in response to the first driving voltage VGL received from the first driving voltage terminal VT1, and thus, the low voltage L of the PQ node PQ is transferred to the Q node Q.

The second output part 146 includes the second transistor T2. The second transistor T2 is turned on in response to the low voltage L of the Q node Q, and thus the high voltage H of the first clock signal CLK1 is outputted through the output terminal OT. The first electrode of the second capacitor CQ receives the high voltage H of the output terminal OT and the second electrode of the second capacitor CQ receives the low voltage L of the Q node Q.

The holding part 147 includes the seventh transistor T7 and the sixth transistor T6. The seventh transistor T7 is turned off in response to the high voltage H of the second clock signal CLK2, and the sixth transistor T6 is turned on in response to the low voltage L of the QB node QB.

Therefore, during the first period 'a', the output terminal OT of the n-th circuit stage CSn may output the high voltage H received from the first and second output parts 144 and 146.

Referring to the second period 'b', the first clock signal CLK1 has the high voltage H, the second clock signal CLK2 has the low voltage L, the third clock signal GCK had the high voltage H, and the (n−1)-th scan signal Sn−1 has the high voltage H.

The simultaneous driving part 148 includes the ninth transistor T9. The ninth transistor T9 is turned off in response to the high voltage H of the third clock signal GCK.

The first input part 141 includes the third transistor T3. The third transistor T3 is turned off in response to the high voltage H of the first clock signal CLK1.

The second input part 142 includes the fourth transistor T4. The fourth transistor T4 is turned on in response to the low voltage L that is a previous voltage applied to the PQ node PQ and thus, the high voltage H of the first clock signal CLK1 is transferred to the QB node QB.

The first output control part 143 includes the fifth transistor T5. The fifth transistor T5 is turned off in response to the high voltage H of the first clock signal CLK1.

The first output part 144 includes the first transistor T1. The first transistor T1 is turned off in response to the high voltage H of the QB node QB and thus, the first output part 144 does not apply a signal to the output terminal OT.

The second output control part 145 includes the eighth transistor T8. The eighth transistor T8 is turned on in response to the first driving voltage VGL received from the first driving voltage terminal VT1 and thus, the low voltage L of the PQ node PQ is transferred to the Q node Q.

The second output part 146 includes the second transistor T2. The second transistor T2 is turned on in response to the low voltage L of the Q node Q and thus, the low voltage L of the second clock signal CLK2 is transferred to the output terminal OT. The first electrode of the second capacitor CQ which is connected to the output terminal OT receives the low voltage L of the first clock signal CLK1, and thus the second capacitor CQ is bootstrapped. Therefore, a voltage applied to the second electrode of the second capacitor CQ is changed from the low voltage L to the bootstrapped voltage 2L.

The Q node Q connected to the second electrode of the second capacitor CQ receives the bootstrapped voltage 2L, and the second transistor T2 is turned on in response to the bootstrapped voltage 2L. Thus, the low voltage L of the first clock signal CLK1 is transferred to the output terminal OT.

The holding part 147 includes the seventh transistor T7. The seventh transistor T7 is turned on in response to the low voltage L of the first clock signal CLK1 and the sixth transistor T6 is turned off in response to the high voltage H of the QB node QB.

Therefore, during the second period 'b', the n-th circuit stage CSn may output the low voltage L received from the second output part 146 through the output terminal OT.

Referring to the third period 'c', the first clock signal CLK1 has low voltage L, the second clock signal CLK2 has the high voltage H, the third clock signal GCK has the high voltage H and the (n−1)-th scan signal Sn−1 has the high voltage H.

The simultaneous driving part 148 includes the ninth transistor T9. The ninth transistor T9 is turned off in response to the high voltage H of the third clock signal GCK.

The first input part 141 includes the third transistor T3. The third transistor T3 is turned on in response to the low voltage L of the first clock signal CLK1 and thus the high voltage H of the (n−1)-th scan signal Sn−1 is transferred to the PQ node PQ.

The second input part 142 includes the fourth transistor T4. The fourth transistor T4 is turned off in response to the high voltage H of the PQ node PQ.

The first output control part 143 includes the fifth transistor T5. The fifth transistor T5 is turned on in response to the low voltage L of the first clock signal CLK1 and thus, the low voltage L of the first clock signal CLK1 is transferred to the QB node QB.

The first output part 144 includes the first transistor T1. The first transistor T1 is turned on in response to the low voltage L of the QB node QB and thus, the high voltage H of the third clock signal GCK received from the third clock terminal CT3 is transferred to the output terminal OT. The first electrode of the first capacitor CQB receives the high voltage H of the third clock signal GCK, and the second electrode of the first capacitor CQB receives the low voltage of the QB node QB.

The second output control part 145 includes the eighth transistor T8. The eighth transistor T8 is turned on in response to the first driving voltage VGL received from the first driving voltage terminal VT1 and thus, the high voltage H of the PQ node PQ is transferred to the Q node Q.

The second output part 146 includes the second transistor T2. The second transistor T2 is turned off in response to the high voltage H of the Q node Q.

The holding part 147 includes the seventh transistor T7 and the sixth transistor T6. The seventh transistor T7 is turned off in response to the high voltage H of the second clock signal CLK2 and the sixth transistor T6 is turned on in response to the low voltage L of the QB node QB.

Therefore, during the third period 'c', the n-th circuit stage CSn may output the high voltage H received from the first output part 144 through the output terminal OT.

Referring to the fourth period 'd', the first clock signal CLK1 has high voltage H, the second clock signal CLK2 has the low voltage L, the third clock signal GCK has the high voltage H, and the (n−1)-th scan signal Sn−1 has the high voltage H.

The simultaneous driving part 148 includes the ninth transistor T9. The ninth transistor T9 is turned off in response to the high voltage H of the third clock signal GCK.

The first input part 141 includes the third transistor T3. The third transistor T3 is turned off in response to the high voltage H of the first clock signal CLK1.

The second input part 142 includes the fourth transistor T4. The fourth transistor T4 is turned off in response to the high voltage H which is a previous voltage applied to the PQ node PQ.

The first output control part 143 includes the fifth transistor T5. The fifth transistor T5 is turned off in response to the high voltage H of the first clock signal CLK1 and thus, the low voltage L of the QB node QB that is the previous voltage is maintained.

The first output part 144 includes the first transistor T1. The first transistor T1 is turned on in response to the low voltage L of the QB node QB and thus, the high voltage H of the third clock signal GCK received from the third clock terminal CT3 is transferred to the output terminal OT. The first electrode of the first capacitor CQB receives the high voltage H of the third clock signal GCK and the second electrode of the first capacitor CQB receives the low voltage L of the QB node QB.

The second output control part 145 includes the eighth transistor T8. The eighth transistor T8 is turned on in response to the first driving voltage VGL received from the first driving voltage terminal VT1 and thus, the high voltage H of the PQ node PQ is transferred to the Q node Q.

The second output part 146 includes the second transistor T2. The second transistor T2 is turned off in response to the high voltage H of the Q node Q.

The holding part 147 includes the seventh transistor T7 and the sixth transistor T6. The seventh transistor T7 is turned on in response to the low voltage L of the second clock signal CLK2 and the sixth transistor T6 is turned on in response to the low voltage L of the QB node QB. The holding part 147 maintains the Q node Q and the output terminal OT into the high voltage H.

Therefore, during the fourth period 'd', the n-th circuit stage CSn may output the high voltage H received from the first output part 144 through the output terminal OT.

As described above, the n-th circuit stage outputs the low voltage L to the n-th scan line during all the simultaneous driving period TD1_SIM. In addition, the n-th circuit stage outputs the low voltage L to the n-th scan line during the n-th horizontal period Hn of the sequential driving period TD2_SEQ and the high voltage H to the n-th scan line during remaining horizontal periods of the sequential driving period TD2_SEQ.

According to the exemplary embodiment, the scan driver simultaneously outputs a plurality of scan signals during the simultaneous driving period and sequentially outputs a plurality of scan signals during the sequential driving period.

Hereinafter, the same reference numerals will be used to refer to the same or like parts as those described in the previous exemplary embodiment, and any repetitive detailed explanation will be omitted.

Figure 6:
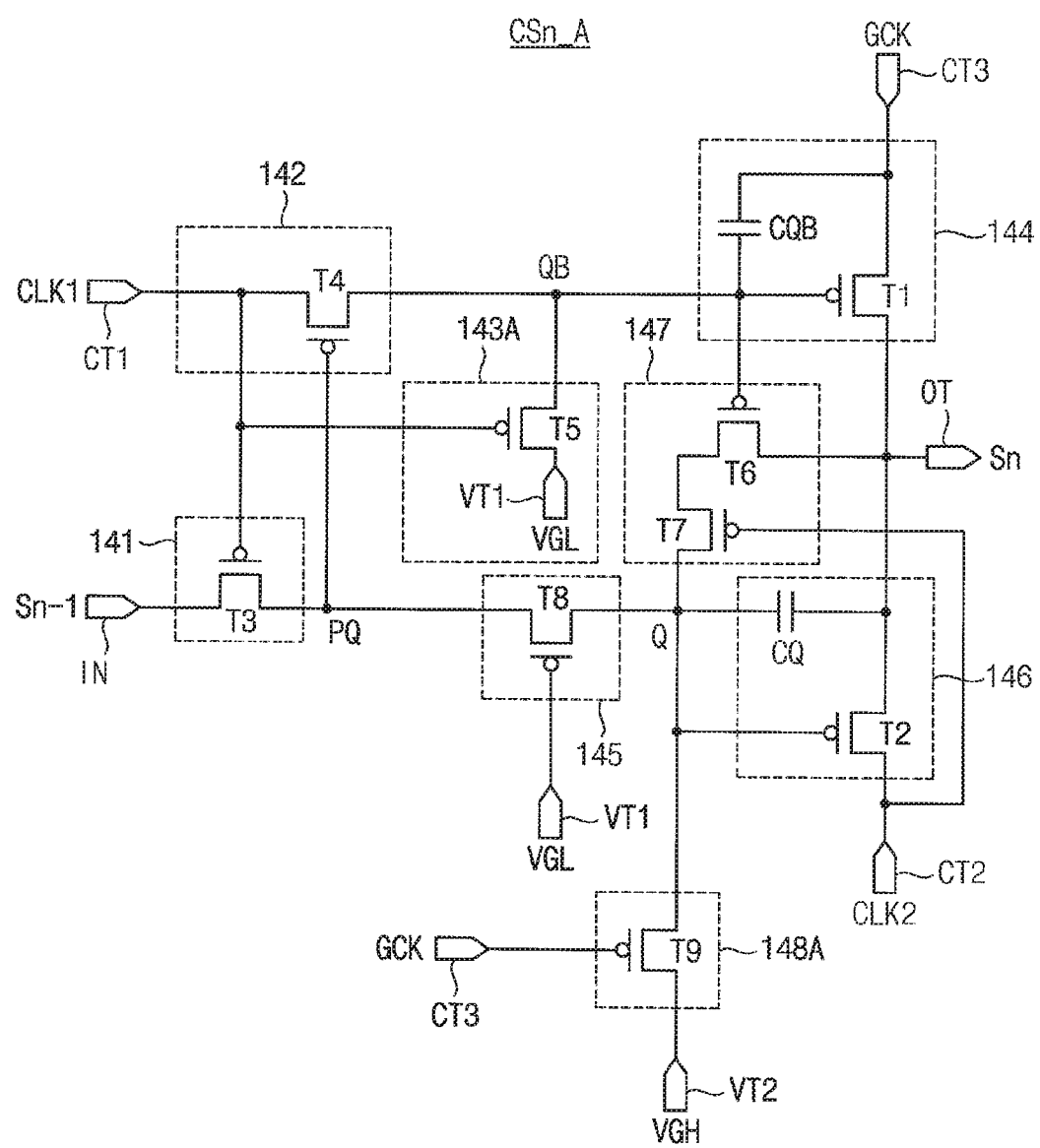
FIG. 6 is a circuit diagram illustrating a circuit stage according to one exemplary embodiment.

FIG. 6 is a circuit diagram illustrating a circuit stage according to one exemplary embodiment.

Referring to FIG. 6, the n-th circuit stage CSn_A may include a first input part 141, a second input part 142, a first output control part 143A, a first output part 144, a second output control part 145, a second output part 146, a holding part 147 and a simultaneous driving part 148A.

According to one exemplary embodiment, the first output control part 143A includes a fifth transistor T5.

The fifth transistor T5 includes a control electrode connected to the first clock terminal CT1, a first electrode connected to the QB node and a second electrode connected to the first driving voltage terminal VT1.

According to one exemplary embodiment, the simultaneous driving part 148A includes a ninth transistor T9.

The ninth transistor T9 includes a control electrode connected to the third clock terminal CT3, a first electrode connected to the second driving voltage terminal VT2 and a second electrode connected to the Q node Q.

A method of driving the n-th circuit stage CSn_A according to one exemplary embodiment is the same as those described in the previous exemplary embodiment, and any repetitive detailed explanation will be omitted.

Figure 7:
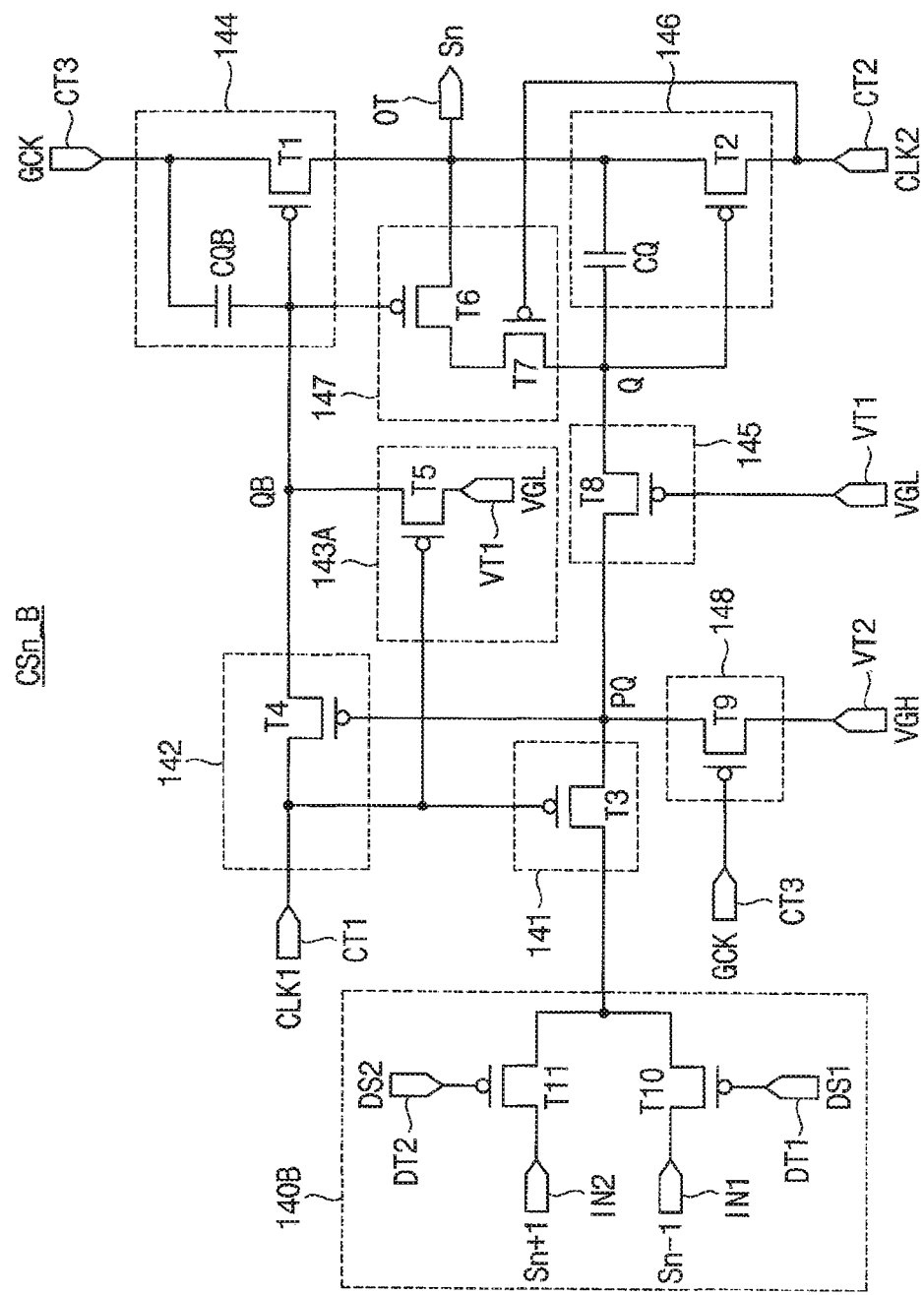
FIG. 7 is a circuit diagram illustrating a circuit stage according to one exemplary embodiment.

FIG. 7 is a circuit diagram illustrating a circuit stage according to one exemplary embodiment.

Referring to FIG. 7, the n-th circuit stage CSn_B may include a selecting part 140B, a first input part 141, a second input part 142, a first output control part 143A, a first output part 144, a second output control part 145, a second output part 146, a holding part 147 and a simultaneous driving part 148.

According to one exemplary embodiment, the first output control part 143A includes a fifth transistor T5. The fifth transistor T5 includes a control electrode and a first electrode which are connected to the first clock terminal CT1, and a second electrode connected to the QB node QB.

The simultaneous driving part 148 includes a ninth transistor T9. The ninth transistor T9 includes a control electrode connected to the third clock terminal CT3, a first electrode connected to the second driving voltage terminal VT2 and a second electrode connected to the PQ node PQ.

The selecting part 140B transfers an (n−1)-th scan signal Sn−1 which is a previous scan signal or an (n+1)-th scan signal Sn+1 which is a next scan signal to the first input part 141 based on a first direction signal DS1 and a second direction signal DS2.

The selecting part 140B includes a first input terminal IN1, a second input terminal IN2, a first direction terminal DT1 and a second direction terminal DT2. The selecting part 140B further includes a tenth transistor T10 and an eleventh transistor T11.

The first input terminal IN1 receives the (n−1)-th scan signal Sn−1 which is a scan signal of a previous circuit stage.

The second input terminal IN2 receives the (n+1)-th scan signal Sn+1 which is a scan signal of a next circuit stage.

The first direction terminal DT1 receives a first direction signal DS1 corresponding to a first scan direction (forward direction).

The second direction terminal DT2 receives a second direction signal DS2 corresponding to a second scan direction (reverse direction).

The tenth transistor T10 includes a control electrode connected to the first direction terminal DT1, a first electrode connected to the first input terminal IN1 and a second electrode connected to the first input part 141. The tenth transistor T10 is turned on in response to the low voltage L of the first direction signal DS1 corresponding to the first scan direction (forward direction) received from the first direction terminal DT1 and thus, the (n−1)-th scan signal Sn−1 is transferred to the first input part 141.

The eleventh transistor T11 includes a control electrode connected to the second direction terminal DT2, a first electrode connected to the second input terminal IN2 and a second electrode connected to the first input part 141. The first 1 transistor T11 is turned on in response to the low voltage L of the second direction signal DS2 corresponding to the second scan direction (reverse direction) received from the second direction terminal DT2 and thus, the (n+1)-th scan signal Sn+1 is transferred to the first input part 141.

Figure 8B:
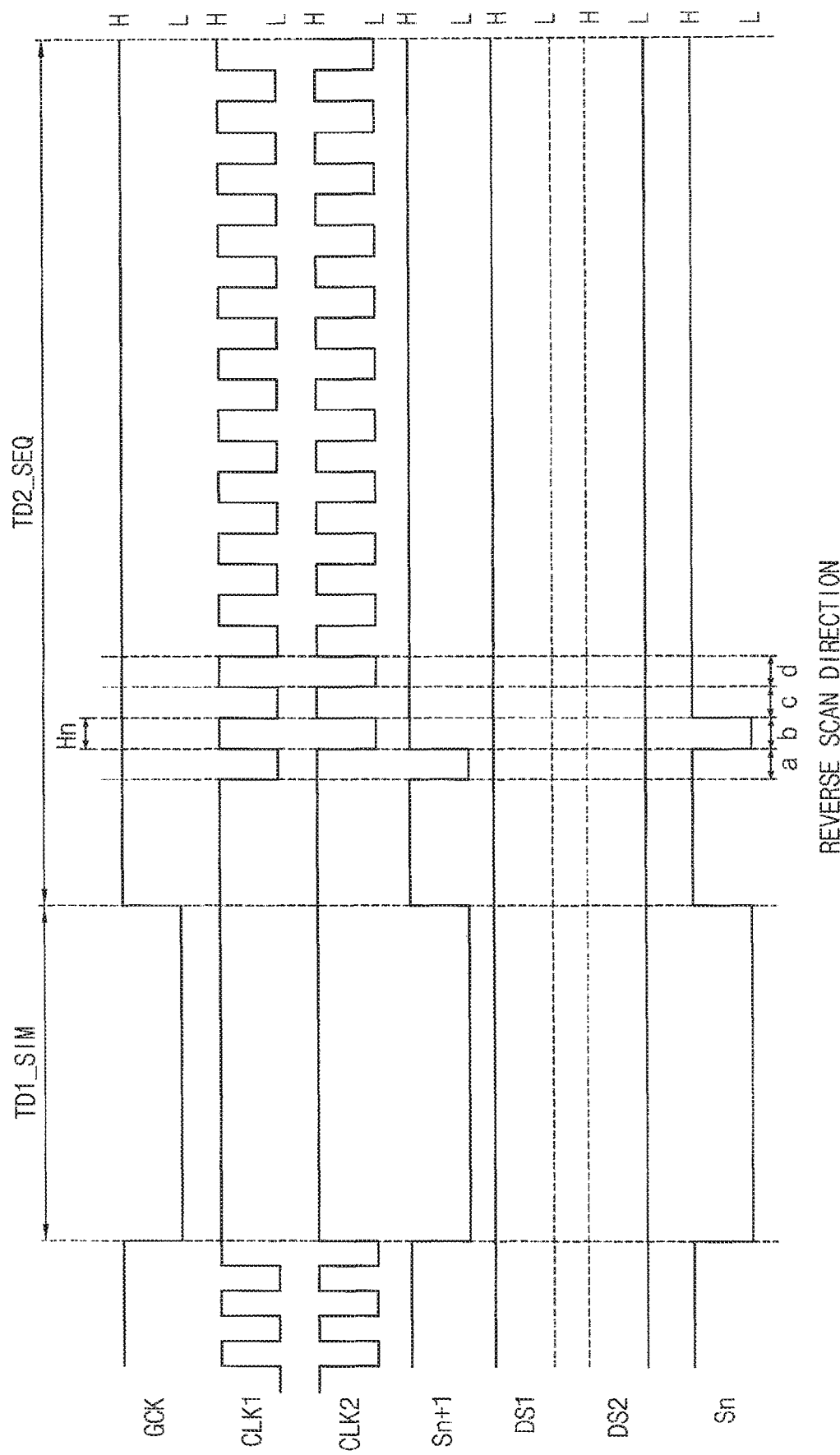

FIGS. 8A and 8B are waveform diagrams illustrating a method of driving the circuit stage according to one exemplary embodiment.

Referring to FIGS. 7 and 8A, when a scan direction of the display panel is the forward direction, the timing controller provides a first direction signal DS1 having a low voltage L and a second direction signal DS2 having a high voltage H to the n-th circuit stage CSn_B.

The selecting part 140B receives the low voltage L of the first direction signal DS1 and the high voltage H of the second direction signal DS2. The tenth transistor T10 is turned on in response to the low voltage L of the first direction signal DS1 and thus, the (n−1)-th scan signal Sn−1 is applied to the first input part 141.

However, referred to FIGS. 7 and 8B, when a scan direction of the display panel is the reverse direction, the timing controller provides a second direction signal DS2 having the high voltage H and a second direction signal DS2 having the low voltage L to the n-th circuit stage CSn_B.

The selecting part 140B receives the high voltage H of the first direction signal DS1 and the low voltage L of the second direction signal DS2. The eleventh transistor T11 is turned on in response to the low voltage L of the second direction signal DS2 and thus, the (n+1)-th scan signal Sn+1 is applied to the first input part 141.

A method of driving the n-th circuit stage CSn_B in the simultaneous driving period and the sequential driving period is the same as those described in the previous exemplary embodiment, and any repetitive detailed explanation will be omitted.

Figure 9:
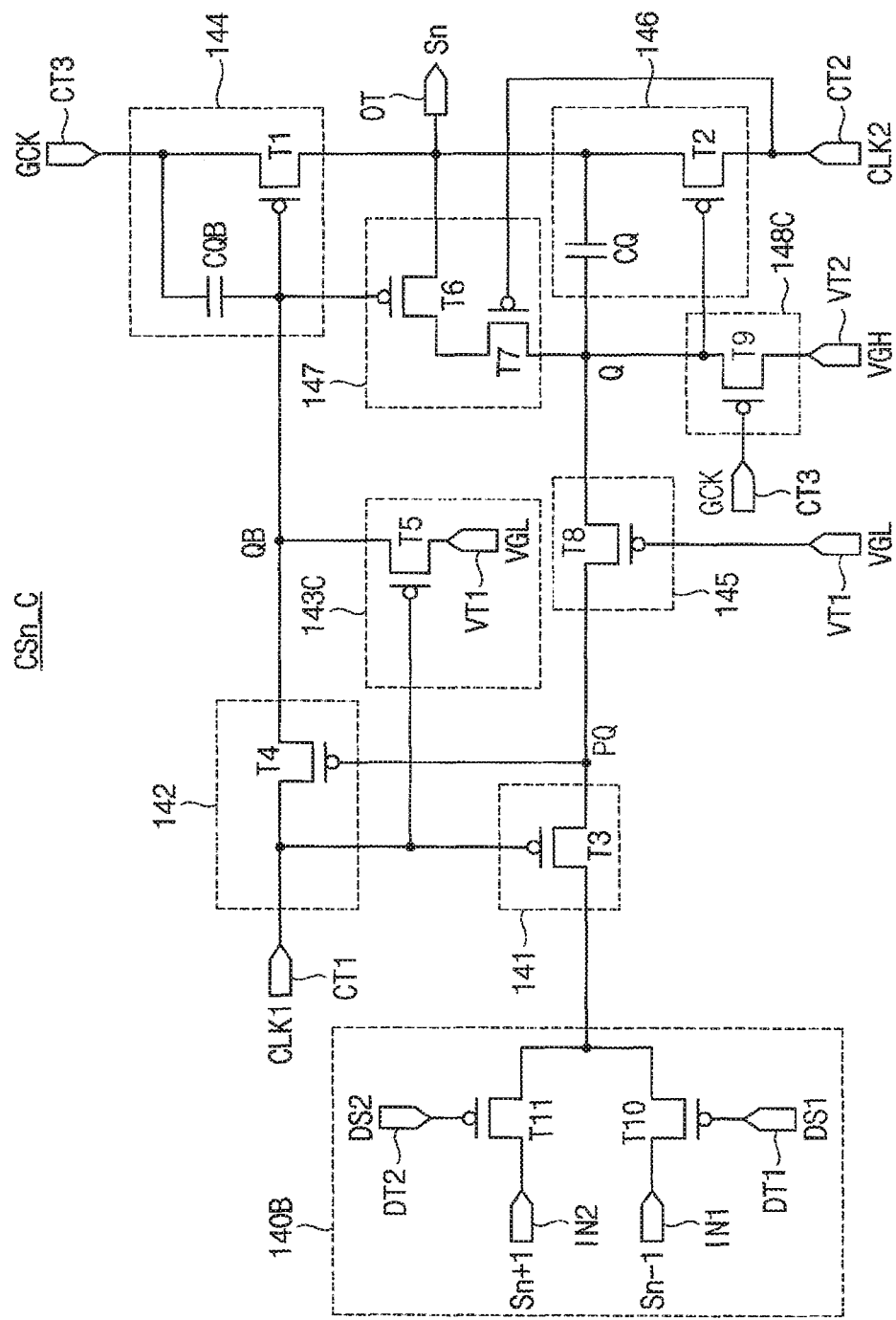
FIG. 9 is a circuit diagram illustrating a circuit stage according to one exemplary embodiment.

FIG. 9 is a circuit diagram illustrating a circuit stage according to one exemplary embodiment.

Referring to FIG. 9, the n-th circuit stage CSn_C may include a selecting part 140B, a first input part 141, a second input part 142, a first output control part 143C, a first output part 144, a second output control part 145, a second output part 146, a holding part 147 and a simultaneous driving part 148C.

According to one exemplary embodiment, the first output control part 143C includes a fifth transistor T5. The fifth transistor T5 includes a control electrode connected to the first clock terminal CT1, a first electrode connected to the first driving voltage terminal VT1 and a second electrode connected to the QB node QB.

The simultaneous driving part 148C includes a ninth transistor T9. The ninth transistor T9 includes a control electrode connected to the third clock terminal CT3, a first electrode connected to the second driving voltage terminal VT2 and a second electrode connected to the Q node Q.

A method of driving the n-th circuit stage CSn_C according to one exemplary embodiment is the same as those described in the previous exemplary embodiment, and any repetitive detailed explanation will be omitted.

According to the exemplary embodiments, the scan driver may simultaneously output a plurality of scan signals during the simultaneous driving period and sequentially output a plurality of scan signals during the sequential driving period. In addition, in the sequential driving period, the scan driver may sequentially output a plurality of scan signals along the forward direction or sequentially output a plurality of scan signals along the reverse direction.

The present inventive concepts may be applied to a display device and an electronic device having the display device. For example, the present inventive concepts may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A scan driver comprising a plurality of circuit stages cascade-connected with each other and outputting a plurality of gate signals, each of the plurality of circuit stages comprising:
    a first input part configured to transfer a carry signal to a first node in response to a first clock signal;
    a second input part configured to transfer the first clock signal to a second node in response to a signal of the first node;
    a first output part configured to transfer a third clock signal to an output terminal in response to a signal of the second node;
    a holding part configured to maintain a signal of a third node in response to a second clock signal;
    a second output part configured to transfer a signal of the third node to the output terminal in response to the second clock signal;
    a first output control part configured to transfer the first clock signal to the second node in response to the first clock signal; and
    a second output control part configured to transfer a signal of the first node to the third node in response to a first driving voltage,
    wherein the second output control part comprises:
        an eighth transistor including a control electrode connected to a first driving voltage terminal and receiving always constant voltage that is the first driving voltage, a first electrode connected to the first node, and a second electrode connected to the third node.

2. The scan driver of claim 1, wherein the holding part comprises a sixth transistor and a seventh transistor, the sixth transistor comprises a control electrode connected to the second node, a first electrode connected to the seventh transistor and a second electrode connected to the output terminal, and the seventh transistor comprises a control electrode receiving the second clock signal, a first electrode connected to the third node and a second electrode connected to the sixth transistor.

3. The scan driver of claim 1, further comprising a simultaneous driving part configured to control the second output part in response to the third clock signal, wherein the third clock signal has a first level for a simultaneous driving period and a second level for a sequential driving period, and the simultaneous driving part is configured to apply a second level of a second driving voltage to the third node in response to the first level of the third clock signal in the simultaneous driving period.

4. The scan driver of claim 3, wherein the simultaneous driving part comprises a ninth transistor, the ninth transistor comprises a control electrode connected to a third clock terminal, a first electrode connected to a second driving voltage terminal and a second electrode connected to the first node.

5. The scan driver of claim 3, wherein the simultaneous driving part comprises a ninth transistor, the ninth transistor comprises a control electrode connected to a third clock terminal, a first electrode connected to a second driving voltage terminal and a second electrode connected to the third node.

6. The scan driver of claim 1, wherein the first output part comprises a first transistor and a first capacitor, the first transistor comprises a control electrode connected to the second node, a first electrode connected to a third clock terminal and a second electrode connected to the output terminal, and the first capacitor comprises a first electrode connected to the third clock terminal and a second electrode connected to the second node.

7. The scan driver of claim 1, wherein the second output part comprises a second transistor and a second capacitor, the second transistor comprises a control electrode connected to the third node, a first electrode connected to a second clock terminal and a second electrode connected to the output terminal, and the second capacitor comprises a first electrode connected to the output terminal and a second electrode connected to the third node.

8. The scan driver of claim 1, further comprising:

a selecting part configured to output a previous scan signal outputted from a previous circuit stage of the plurality of circuit stages or a next scan signal outputted from a next circuit stage of the plurality of circuit stages to the first input part in response to a first direction signal and a second direction signal.

9. A display device comprising:

a display panel comprising a switching transistor connected to a scan line and a data line, an emission control transistor connected to the switching transistor and an organic light emitting diode;

a timing controller configured to generate a first clock signal, a second clock signal different from the first clock signal and a third clock signal different from the first clock signal and the second clock signal;

a scan driver configured to generate a plurality of scan signals based on the first clock signal, the second clock signal, and the third clock signal, to simultaneously output the plurality of scan signals during a simultaneous driving period and to sequentially output the plurality of scan signals during a sequential driving period, the scan driver comprises a plurality of circuit stages cascade-connected with each other, each circuit stage of the plurality of circuit stages comprising:

a first input part configured to transfer a carry signal to a first node in response to a first clock signal;

a second input part configured to transfer the first clock signal to a second node in response to a signal of the first node;

a first output part configured to transfer a third clock signal to an output terminal in response to a signal of the second node;

a holding part configured to maintain a signal of a third node in response to a second clock signal;

a second output part configured to transfer a signal of the third node to the output terminal in response to the second clock signal:

a first output control part configured to transfer the first clock signal to the second node in response to the first clock signal; and a second output control part configured to transfer a signal of the first node to the third node in response to a first driving voltage, wherein the second output control part comprises:

an eighth transistor including a control electrode connected to a first driving voltage terminal and receiving always constant voltage that is the first driving voltage, a first electrode connected to the first node, and a second electrode connected to the third node.

10. The display device of claim 9, wherein the holding part comprises a sixth transistor and a seventh transistor, the sixth transistor comprises a control electrode connected to the second node, a first electrode connected to the seventh transistor and a second electrode connected to the output terminal, and the seventh transistor comprises a control electrode receiving the second clock signal, a first electrode connected to the third node and a second electrode connected to the sixth transistor.

11. The display device of claim 9, wherein each circuit stage of the plurality of circuit stages further comprises a simultaneous driving part configured to turn off the second output part in response to the third clock signal, wherein the third clock signal has a first level for a simultaneous driving period and a second level for a sequential driving period, and the simultaneous driving part configured to apply a second level of a second driving voltage to the third node in response to the first level of the third clock signal in the simultaneous driving period.

12. The display device of claim 11, wherein the simultaneous driving part comprises a ninth transistor, the ninth transistor comprises a control electrode connected to a third clock terminal, a first electrode connected to a second driving voltage terminal, and a second electrode connected to the first node.

13. The display device of claim 11, wherein the simultaneous driving part comprises a ninth transistor, the ninth transistor comprises a control electrode connected to the third clock terminal, a first electrode connected to a second driving voltage terminal and a second electrode connected to the third node.

14. The display device of claim 9, wherein the first output part comprises a first transistor and a first capacitor, the first transistor comprises a control electrode connected to the second node, a first electrode connected to a third clock terminal and a second electrode connected to the output terminal, and the first capacitor comprises a first electrode connected to the third clock terminal and a second electrode connected to the second node.

15. The display device of claim 9, wherein the second output part comprises a second transistor and a second capacitor, the second transistor comprises a control electrode connected to the third node, a first electrode connected to a second clock terminal and a second electrode connected to the output terminal, and the second capacitor comprises a first electrode connected to the output terminal and a second electrode connected to the third node.

16. The display device of claim 9, wherein the timing controller is configured to output a first direction signal corresponding to a forward direction scan direction and a second direction signal corresponding to a reverse direction scan direction to the scan driver, and each circuit stage of the plurality of circuit stages further comprises a selecting part configured to output a previous scan signal outputted from a previous circuit stage of the plurality of circuit stages or a next scan signal outputted from a next circuit stage of the plurality of circuit stages to the first input part in response to a first direction signal and a second direction signal.

\* \* \* \* \*